United States Patent
Maekawa

(10) Patent No.: US 6,864,183 B2
(45) Date of Patent: Mar. 8, 2005

(54) METHOD FOR MANUFACTURING A SEMICONDUCTOR DEVICE

(75) Inventor: Kazuyoshi Maekawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/273,151

(22) Filed: Oct. 18, 2002

(65) Prior Publication Data

US 2003/0203606 A1 Oct. 30, 2003

(30) Foreign Application Priority Data

Apr. 26, 2002 (JP) ........................................ 2002-125948

(51) Int. Cl.$^7$ ........................ H01L 21/44; H01L 21/302
(52) U.S. Cl. ........................ 438/710; 438/655; 438/682; 438/723
(58) Field of Search ........................ 438/706, 710, 438/723, 581, 630, 649, 651, 685, 664, 682, 592, 768–770

(56) References Cited

U.S. PATENT DOCUMENTS

| | | | | |
|---|---|---|---|---|
| 5,464,782 A | * | 11/1995 | Koh | |
| 5,498,768 A | * | 3/1996 | Nishitani et al. | 438/644 |
| 5,744,395 A | * | 4/1998 | Shue et al. | 438/305 |
| 5,770,507 A | * | 6/1998 | Chen et al. | |
| 5,953,633 A | * | 9/1999 | Chen et al. | |
| 6,313,042 B1 | * | 11/2001 | Cohen et al. | |
| 6,680,485 B1 | * | 1/2004 | Carey et al. | 257/57 |

FOREIGN PATENT DOCUMENTS

| | | |
|---|---|---|
| JP | 1-108723 | 4/1989 |
| JP | 5-267207 | 10/1993 |
| JP | 10-233371 | 9/1998 |

* cited by examiner

Primary Examiner—Ha Tran Nguyen
(74) Attorney, Agent, or Firm—Burns, Doane, Swecker & Mathis, L.L.P.

(57) ABSTRACT

Plasma etching is performed using a mixed gas of at least one or more fluorine-containing gases selected from the group consisting of a nitrogen trifluoride gas, a hydrogen fluoride gas, a dicarbon hexafluoride gas, a carbon tetrafluoride gas and a sulfur hexafluoride gas, and an argon gas to remove a native oxide film 5 being on a silicon substrate 1 and a gate electrode 3, followed by forming a metal silicide film on the silicon substrate 1 and the gate electrode 3.

6 Claims, 8 Drawing Sheets

METHOD FOR MANUFACTURING A SEMICONDUCTOR DEVICE

BACKGROUND OF THE INVENTION

1. Field of the Invention

The present invention relates to a method for manufacturing a semiconductor device, and more particularly, to a method for manufacturing a semiconductor device wherein, while avoiding the re-deposition of the native oxide film once removed by etching, the electric characteristics of the device is prevented from being lowered.

2. Background Art

When the parasitic capacitances of a diffusion resistance layer in a source/drain region and a gate electrode resistance increase as a result of the scale-down and the high degree of integration of a semiconductor device being in progress, signal transmission is delayed thereby impeding high-speed operations. In order to realize a high-speed device by reducing the parasitic capacitance, a technique has been adopted wherein a source/drain region and a gate electrode region are self-alignmently converted to a metal silicide.

FIGS. 7 and 8 are views each showing an example of the conventional step of forming a cobalt silicide film. In FIG. 7(a), agate insulating film 23 made of a silicon oxide film, a gate electrode 24 made of a polysilicon film, and a side wall 25 made of a silicon oxide film are formed on a silicon substrate 22.

Since the surface of silicon is active, a native oxide film 26 naturally formed in air exists (FIG. 7(b)). To cope with this, as shown in FIG. 7(c), plasma etching is carried out by use of an argon (Ar) gas so that the native oxide films 26 formed on the surfaces of the silicon substrate 22 and the gate electrode 2A are removed. Subsequently, after deposition of a cobalt (Co) film (as 27 in FIG. 8(b)) by a sputtering method, conversion into a silicide by thermal treatment, selective etching and annealing are carried to form a cobalt silicide ($CoSi_2$) film (as 28 in FIG. 8(c)).

As a result of intensive studies made by the present inventors, it has been found that the above-stated silicide film-forming process has the following problems.

When the native oxide film 26 is removed by physical sputtering using an argon gas prior to the deposition of the cobalt film 27, a residue 29 of the etched native oxide film is deposited on the sidewalls 25 as shown in FIG. 8(a). The silicon oxide ($SiO_2$) constituting the native oxide film 27 is decomposed into silicon (Si) by the action of a plasma made of the argon gas, and thus, the resulting residue 29 contains silicon aside from silicon oxide. Accordingly, when the cobalt film 27 is formed thereon, the silicon in the residue 29 reacts with cobalt to form the cobalt silicide 28 on the sidewall 25 as is particularly shown in FIG. 8(b).

Because silicon oxide or silicon nitride constituting the sidewalls does not react with cobalt, cobalt silicide is not formed at the sidewall in the nature of things. However when a residue of plasma etching is deposited on the sidewall, cobalt silicide is formed on the sidewall, with the attendant problem of causing electric short-circuiting.

In Japanese Patent Laid-open No. Hei 5-267207, attention has been paid to the problem caused by plasma etching with use of an argon gas, and an etching method using a reactive gas in addition to an argon gas is disclosed. However, this publication deals only with the problem of damaging a silicon substrate with etching wiring an argon gas, and no mention is made of the deposition of a residue after etching.

SUMMARY OF THE INVENTION

The invention has been made in order to solve the above problems. More particularly, the invention has for its object the provision of a method for manufacturing a semiconductor substrate having excellent electric characteristics by preventing the native oxide film, removed by etching, from re-deposition such as on side walls.

According to one aspect of the present invention, in a method for manufacturing a semiconductor device, a gate electrode, made of polysilicon, is formed on a silicon substrate through a gate insulating film. A sidewall, made of an insulating film, is formed on side of the gate electrode. Native oxide films formed on the surfaces of the silicon substrate and the gate electrode are removed by plasma etching with use of a mixed gas of at least one or more fluorine gases selected from the group consisting of a nitrogen trifluoride gas, a hydrogen fluoride gas, a dicarbon hexafluoride gas, a carbon tetrafluoride gas and a sulfur hexafluoride gas, and an argon gas. A metal silicide film is formed on the silicon substrate and the gate electrode.

According to another aspect of the present invention, in a method for manufacturing a semiconductor device, a gate electrode, made of polysilicon, is formed on a silicon substrate through a gate insulating film. A sidewall, made of an insulating film, is formed on side of the gate electrode. A native oxide film being on the surfaces of the silicon substrate and the gate electrode is removed by plasma etching with use of an argon gas. The sidewall is etched with an aqueous hydrofluoric acid solution or an aqueous buffered hydrofluoric acid solution for lift-off to remove a residue of the plasma etching deposited on the sidewall. A metal silicide film is formed on the silicon substrate and the gate electrode.

According to another aspect of the present invention, in a method for manufacturing a semiconductor device, an insulating film is formed on a silicon substrate. Contact holes for exposing the silicon substrate therethrough is formed in the insulating film. A native oxide film formed on a silicon substrate surface exposed from the contact holes is removed by plasma etching with use of a mixed gas of at least one or more fluorine gases selected from the group consisting of a nitrogen trifluoride gas, a hydrogen fluoride gas, a dicarbon hexafluoride gas, a carbon tetrafluoride gas and a sulfur hexafluoride gas, and an argon gas. A metal silicide film is formed on the silicon substrate from which the native oxide film has been removed.

Other and further objects, features and advantages of the invention will appear more fully from the following description.

DETAILED DESCRIPTION OF THE PREFERRED EMBODIMENTS

The embodiments of the invention will be described in detail with reference to the accompanying drawings.

First Embodiment

Figure 1:
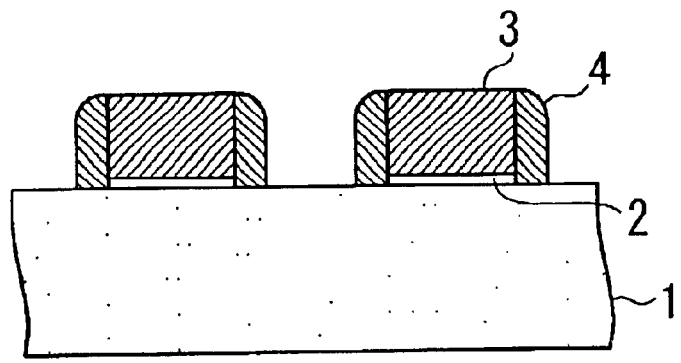
FIG. 1(a)–(c) are schematic sectional views each showing the manufacturing steps of a semiconductor device according to a first embodiment of the invention.
Figure 1:
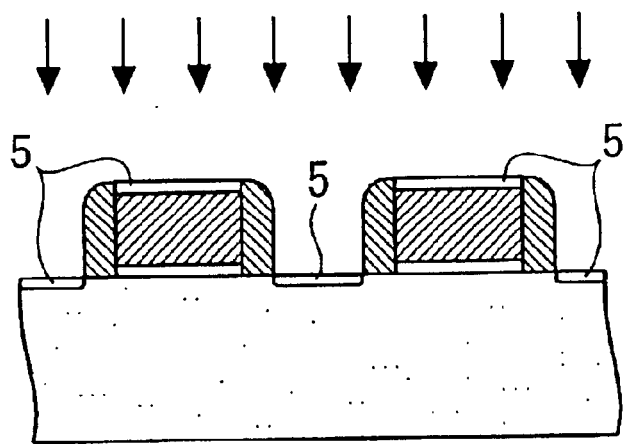
Figure 1:
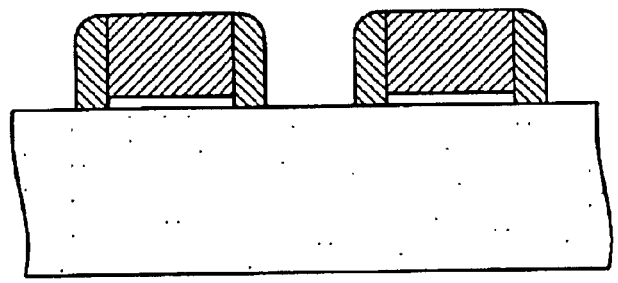
Figure 2:
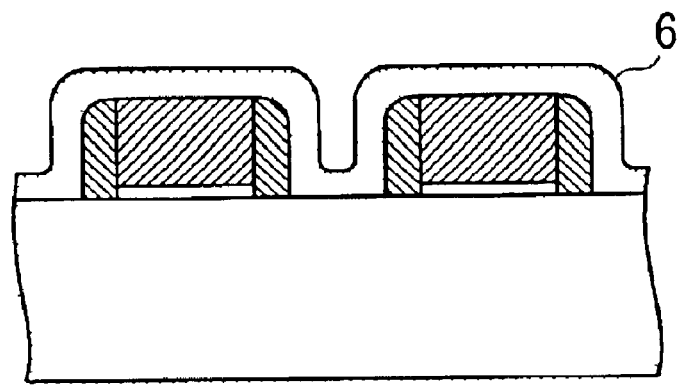
FIG. 2(a)–(c) are schematic sectional views each showing the manufacturing steps of a semiconductor device according to a first embodiment of the invention.
Figure 2:
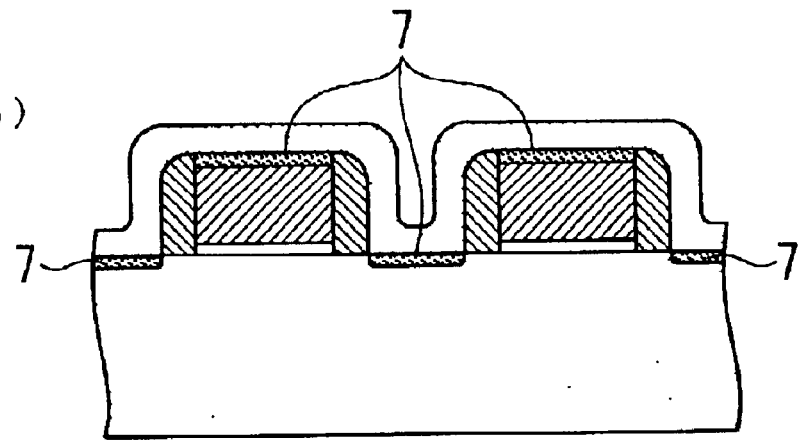
Figure 2:
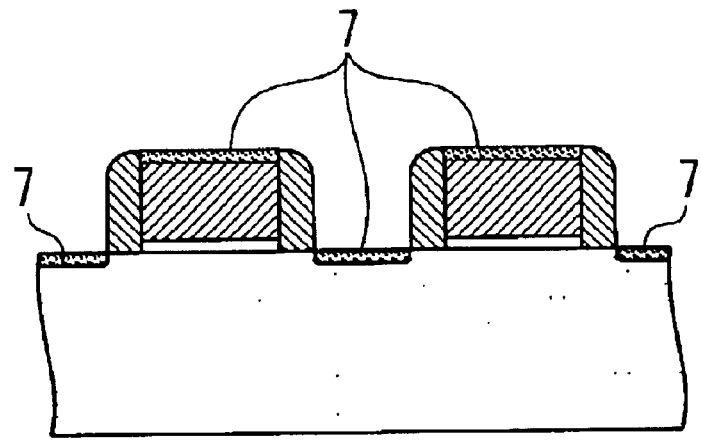

Referring to FIGS. 1 and 2, a method of forming a silicide film according to the embodiment of the invention is described. A gate electrode 3 is formed on a silicon substrate 1 through a gate insulating film 2, after which a side wall 4 made of an insulating film is formed on the side surfaces of the gate electrode 3, respectively, thereby providing a structure of FIG. 1(a). The gate insulating film used may be, for example, a silicon oxide film, a silicon nitride film or the like. Polysilicon may be used as the gate electrode. Moreover, use may be made, as the sidewall, of a silicon oxide film, a silicon nitride film or the like, for example. The sidewall may have a multi-layered structure using a combination of a silicon oxide film and a silicon nitride film. It will be noted that although not particularly shown in FIGS. 1 and 2, the silicon substrate 1 has a source/drain region formed therein by ion implantation.

Initially, the silicon substrate 1 is subjected to RCA washing by use of a chemical solution based on hydrochloric acid, ammonium hydroxide or the like, thereby removing not only metallic impurities and ionic impurities, but also particulate impurities, all attached to the silicon substrate 1. Subsequently, the surface is cleansed by means of an aqueous hydrofluoric acid solution or an aqueous buffered hydrofluoric acid solution.

Next, after transfer to a reduced pressure vapor phase system (not shown), the system is evacuated by means of a vacuum pump to make a reduced pressure condition, followed by plasma etching by introduction of a mixed gas of an argon gas and a nitrogen trifluoride ($NF_3$) gas (FIG. 1(b)). In this way, a native oxide film 5 formed on the silicon substrate 1 and the gate electrode 3 is removed to provide a structure of FIG. 1(c). The ratio of the nitrogen trifluoride gas to the argon gas is set at 0.5 vol % or over.

Thereafter, while keeping the system in vacuum so that a native oxide film is not formed again, the step is transferred to the formation of a cobalt film 6 (FIG. 2(a)). For instance, using the same reduced pressure vapor phase growth system as employed for the removal of the native oxide film, the cobalt film is formed by changing a feed gas. After the film formation, thermal treatment (lamp annealing) at about 400° C. to 500° C. is carried out to cause the silicon substrate 1 and the gate electrode 3 to react with the cobalt film 6, thereby forming cobalt silicide films 7 (FIG. 2(b)).

Subsequently, unreacted cobalt is removed by means of an etching solution having selectivity to the silicide to provide a structure of FIG. 2(c). For the etching solution, a mixed solution of phosphoric acid, nitric acid, acetic acid and hydrogen peroxide, a mixed solution of sulfuric acid and hydrogen peroxide or a mixed solution of hydrochloric acid and hydrogen peroxide may be used, for example. Moreover, thermal treatment at about 650° C. to 850° C. is carried out at least once or more times to cause the crystal structure to be changed, thereby lowering the resistance of the silicide.

According to this embodiment, the use of the mixed gas of an argon gas and a nitrogen trifluoride gas for the removal of the native oxide film ensures the following effects.

The argon ions generated from argon plasma are inert to silicon. When these inert argon ions are collided against the silicon substrate or gate electrode, the native oxide film existing on the surfaces thereof is physically removed. On the other hand, a nitrogen trifluoride gas is a reactive gas and reacts with silicon oxide forming the native oxide film. More particularly, the nitrogen trifluoride gas reacts not only with the native oxide film formed on the surfaces of the silicon substrate and the gate electrode, but also with the native oxide film physically removed by means of the argon ions. The resultant product is evaporated in the form of a gas, followed by evacuation to outside of the reduced pressure vapor phase growth system by means of a vacuum pump. Thus, according to this embodiment, the native oxide film is removed with a plasma using an argon gas and a nitrogen trifluoride gas and exhausted to outside of the reduced pressure vapor phase growth system, so that the thus removed native oxide film is not deposited on side walls as a residue.

The nitrogen trifluoride gas is used in this embodiment and is not limited thereto in the practice of the invention. Other types of gases may also be used so far as they react with a silicon oxide film and is able to etch the film therewith. For instance, fluorine-containing gases may be used including a hydrogen fluoride (HF) gas, a dicarbon hexafluoride ($C_2F_6$) gas, a carbon trifluoride ($CF_4$) gas, a sulfur hexafluoride ($SF_3$) gas and the like.

In this embodiment, the nitrogen trifluoride gas alone is used as the gas mixed with an argon gas. The invention is not limited to the use of this gas, a combination of two or more gases reacting with the silicon oxide film may be used in combination with argon gas. The ratio of the reactive gases being mixed should preferably be 0.5 vol % or over relative to the argon gas.

Second Embodiment

Like the first embodiment, agate electrode is formed on a silicon substrate through a gate insulating film, after which a sidewall, made of an insulating film, is formed on the side surfaces of the gate electrode. A silicon oxide film, a silicon nitride film or the like may be used, for example, as the gate insulating film. Polysilicon may be used as the gate electrode. Moreover, a silicon oxide film, a silicon nitride film or the like may be used, for example, as the sidewall. The sidewall may have a multilayered structure using a combination of a silicon oxide film and a silicon nitride film. In addition, a source/drain region may be formed in the silicon substrate by ion implantation.

Initially, the silicon substrate 1 is subjected to RCA washing with a chemical solution based on hydrochloric acid, ammonium hydroxide or the like, thereby removing not only metallic impurities and ionic impurities, but also particulate impurities, all attached to the silicon substrate 1. Subsequently, the surface is cleansed by means of an aqueous hydrofluoric acid solution or an aqueous buffered hydrofluoric acid solution.

Next, after transfer to a reduced pressure vapor phase system, the system is evacuated by means of a vacuum pump to make a reduced pressure condition, followed by etching with plasma of nitrogen trifluoride gas to remove the native oxide film. In this manner, this embodiment is characterized in that the native oxide film is removed by use of a nitrogen trifluoride gas alone without use of an argon gas.

Thereafter, while keeping the system in vacuum so that a native oxide film is not formed again, the step is transferred to the formation of a cobalt film. For instance, using the same reduced pressure vapor phase growth system as employed for the removal of the native oxide film, the cobalt film is formed by changing a feed gas. After the film formation, thermal treatment (lamp annealing) at about 400° C. to 500° C. is carried out to cause the silicon substrate and the gate electrode to react with the cobalt film, thereby forming cobalt silicide films.

Subsequently, unreacted cobalt is removed by means of an etching solution having selectivity to the silicide. For the etching solution, a mixed solution of phosphoric acid, nitric acid, acetic acid and hydrogen peroxide, a mixed solution of sulfuric acid and hydrogen peroxide or a mixed solution of hydrochloric acid and hydrogen peroxide may be used, for example. Moreover, thermal treatment at about 650° C. to 850° C. is carried out at least once or more times to cause the resultant crystal structure to be changed, thereby lowering the resistance of the silicide.

According to this embodiment, the use of the mixed gas of an argon gas and a nitrogen trifluoride gas for the removal of the native oxide film ensures the following effects.

In the sputter etching using an argon gas, argon ions are collided with a silicon substrate and a gate electrode, with the possibility that the surfaces thereof suffer damage. On the other hand, with the use of a nitrogen trifluoride gas, etching proceeds through chemical reaction with silicon oxide, so that the possibility of suffering the damage of the silicon substrate and gate insulating film can be reduced. In addition, the problem of depositing an etched native oxide film on sidewalls as a residue can be solved.

Although a nitrogen trifluoride gas is used in this embodiment, the invention is not limited to the use thereof. Other types of gases may also be used so far as they react with a silicon oxide film and are able to etch the film therewith. For instance, fluorine-containing gases, such as a hydrogen fluoride (HF) gas, a dicarbon hexafluoride ($C_2F_6$) gas, a carbon trifluoride ($CF_4$) gas, a sulfur hexafluoride ($SF_3$) gas and the like can be used.

Although a nitrogen trifluoride alone is used in this embodiment, the invention is not limited to the use thereof. That is, two or more gases capable of reacting with a silicon oxide film may be used in combination.

Third Embodiment

Figure 3:
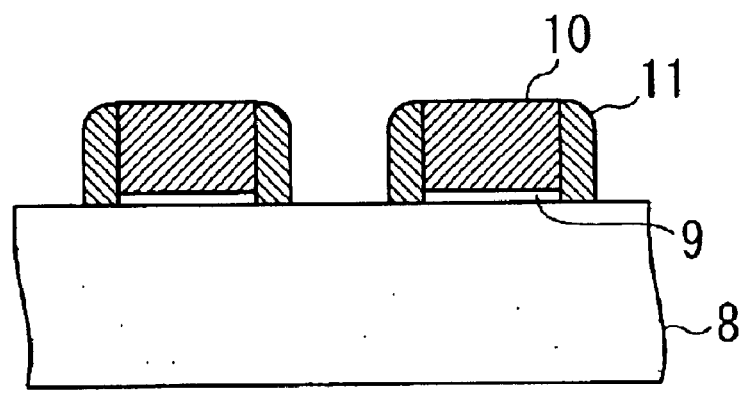
FIG. 3(a)–(c) are schematic sectional views each showing the manufacturing steps of a semiconductor device according to a third embodiment of the invention.
Figure 3:
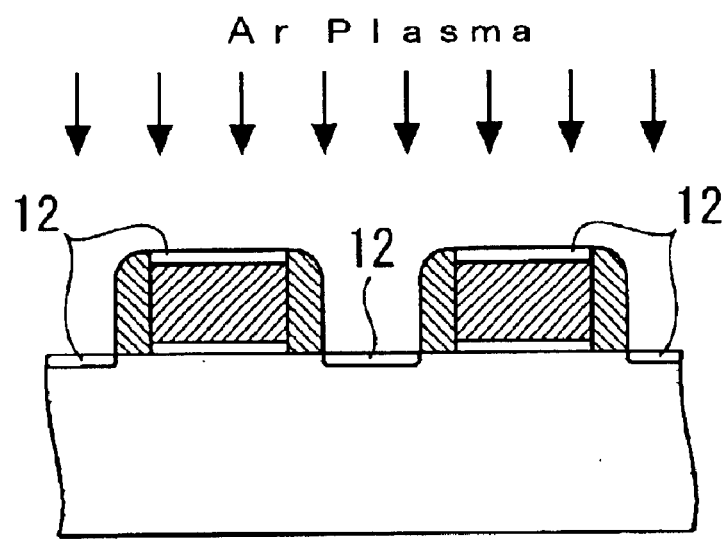
Figure 3:
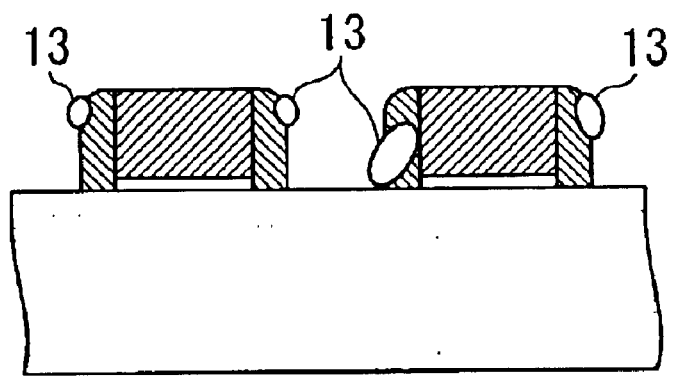
Figure 4:
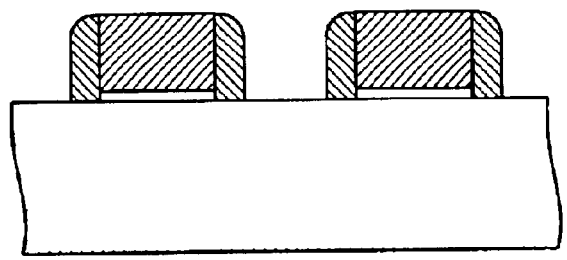
FIG. 4(a)–(d) are schematic sectional views each showing the manufacturing steps of a semiconductor device according to a third embodiment of the invention.
Figure 4:
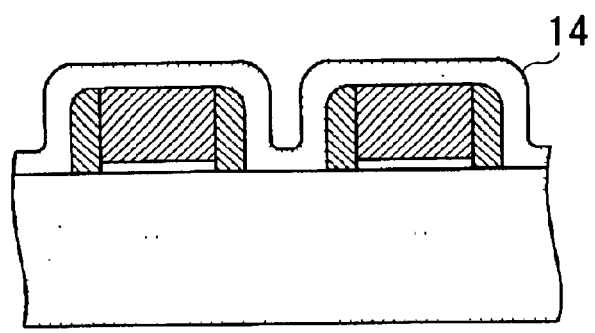
Figure 4:
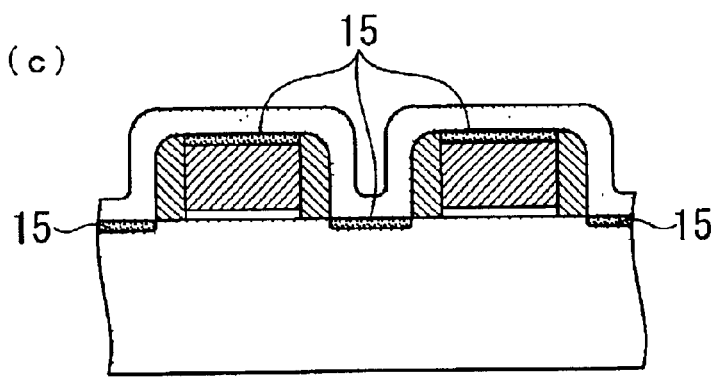
Figure 4:
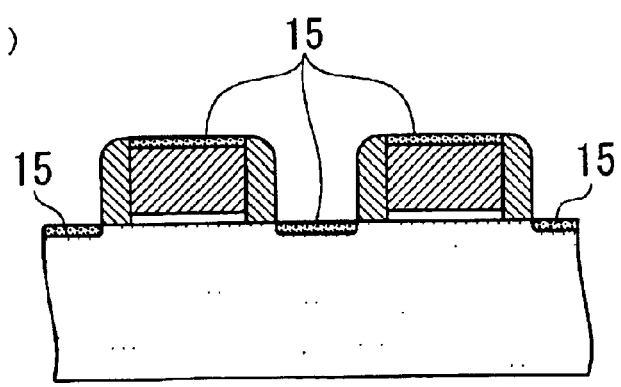

With reference to FIGS. 3 and 4, a method for forming a silicide film according to the invention is described. After a gate electrode 10 is formed on a silicon substrate through a gate insulating film 9, a sidewall 11, made of an insulating film, is formed on the side surfaces of the gate electrode 10 to provide a structure of FIG. 3(*a*). The gate insulating film used may be made, for example, of a silicon oxide film, a silicon nitride film or the like. Polysilicon may be used as the gate electrode. Moreover, the sidewall used may be made, for example, of a silicon oxide film, a silicon nitride film or the like. The sidewall may have a multi-layered structure made of a combination of a silicon oxide film and a silicon nitride film. Although not particularly shown in FIGS. 3 and 4, a source/drain region is formed within the silicon substrate 8 by ion implantation.

Initially, the silicon substrate 8 is subjected to RCA washing by use of a chemical solution based on hydrochloric acid, ammonium hydroxide or the like, thereby removing not only metallic impurities and ionic impurities, but also particulate impurities, all attached to the silicon substrate 8. Subsequently, the surface is cleansed by etching with an aqueous hydrofluoric acid solution or an aqueous buffered hydrofluoric acid solution.

Next, after transfer to a reduced pressure vapor phase system (not shown), the system is evacuated by means of a vacuum pump to make a reduced pressure condition. Thereafter, an argon gas is introduced so as to carry out plasma etching to remove a native oxide film 12 from the surfaces of the silicon substrate 8 and the gate electrode 10 (FIG. 3(*b*)). In this connection, however, only the etching with an argon gas permits an etching residue 13 to be attached on the side wall 11. To avoid this, this embodiment is characterized in that after the etching with an argon gas, further etching, for example, with an aqueous hydrofluoric acid solution diluted to 1:200 is carried out to remove the residue 13 therefrom. More particularly, silicon oxide is dissolved in an aqueous hydrofluoric acid solution and the underlying sidewall 11 is etched to remove the residue 13 through lift-off. An aqueous buffered hydrofluoric acid solution may be used in place of the aqueous hydrofluoric acid solution.

Thereafter, while keeping the system in vacuum so that a native oxide film is not formed again, the step is transferred to the formation of a cobalt film 14 (FIG. 4(*a*)). For instance, using the same reduced pressure vapor phase growth system as employed for the removal of the native oxide film, the cobalt film is formed by changing a feed gas. After the film formation, thermal treatment (lamp annealing) at about 400° C. to 500° C. is carried out to cause the silicon substrate 8 and the gate electrode 10 to react with the cobalt film 8, thereby forming cobalt silicide films 15 (FIG. 4(*c*)).

Subsequently, unreacted cobalt is removed by means of an etching solution having selectivity to the silicide to provide a structure of FIG. 4(*d*). For the etching solution, a mixed solution of phosphoric acid, nitric acid, acetic acid and hydrogen peroxide, a mixed solution of sulfuric acid and hydrogen peroxide or a mixed solution of hydrochloric acid and hydrogen peroxide may be used, for example. Moreover, thermal treatment at about 650° C. to 850° C. is carried out at least once or more times to cause the crystal structure to be changed, thereby lowering the resistance of the silicide.

According to this embodiment, after the plasma etching with an argon gas for the removal of the native oxide film, further etching with an aqueous hydrofluoric acid solution or an aqueous buffered hydrochloric acid solution is carried out, so that the residue formed after the plasma etching can be removed. In addition, the aqueous hydrofluoric acid solution or aqueous buffered hydrofluoric acid solution is one that is usually employed for cleaning along with RCA cleaning, and no fresh device is not necessary, thus being beneficial from the standpoint of costs.

Fourth Embodiment

In the first to third embodiments, an instance is shown where the silicide film is formed on the silicon substrate and gate electrode on a diffusion layer. In this embodiment, the case where a silicide film is formed at a contact between a silicon substrate and an external wiring is illustrated. The invention may be applied to this case.

Figure 5:
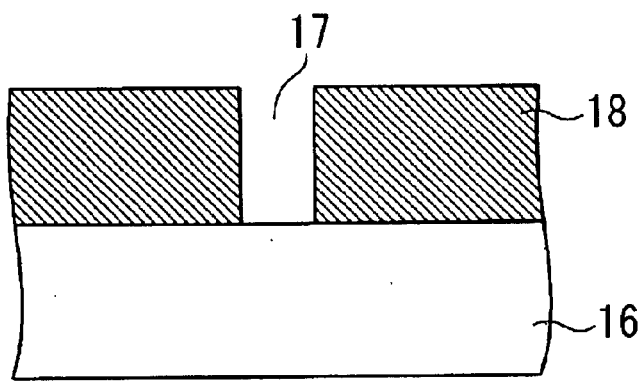
FIG. 5(a)–(d) are schematic sectional views each showing the manufacturing steps of a semiconductor device according to a fourth embodiment of the invention.
Figure 5:
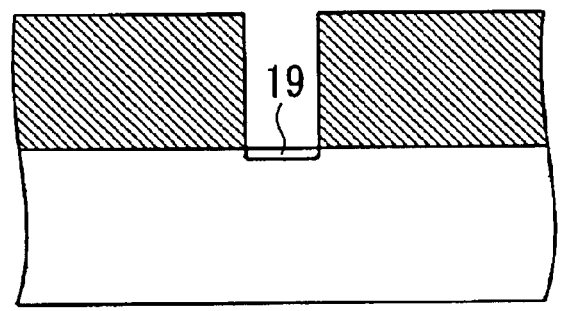
Figure 5:
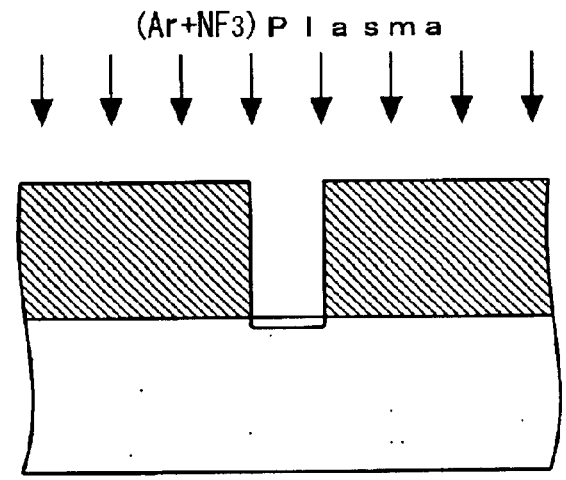
Figure 5:
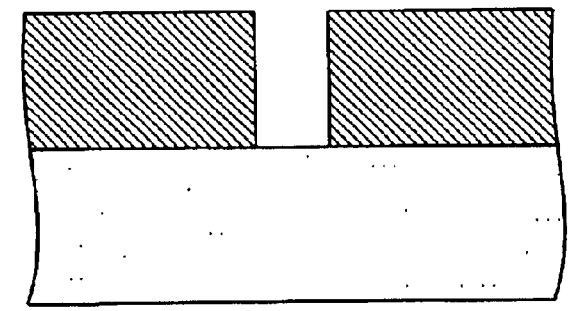

FIG. 5(*a*) shows the state where an insulating film 18 having a contact hole 17 is formed on a silicon substrate 16. A silicon oxide film, a silicon nitride film or the like may be used, for example, as the insulating film 18. Alternatively, the insulating film 18 may have a multi-layered structure using a combination of a silicon oxide film and a silicon nitride film. Because the silicon substrate 16 is exposed at the bottom of the contact hole 7, a native oxide film 19 is formed on the surface thereof (FIG. 5(*b*)). Accordingly, the substrate is transferred to a reduced pressure vapor phase growth system (not shown), and the system is evacuated by means of a vacuum pump to make a reduced pressure condition, after which a mixed gas of an argon gas and a nitrogen trifluoride (NF$_3$) gas is introduced for carrying out plasma etching (FIG. 5(c)). In this way, the native oxide film 19 being on the silicon substrate 16 is removed to provide a structure of FIG. 5(d). The ratio of the nitrogen trifluoride to the argon gas is set at 0.5 vol % or over.

Figure 6:
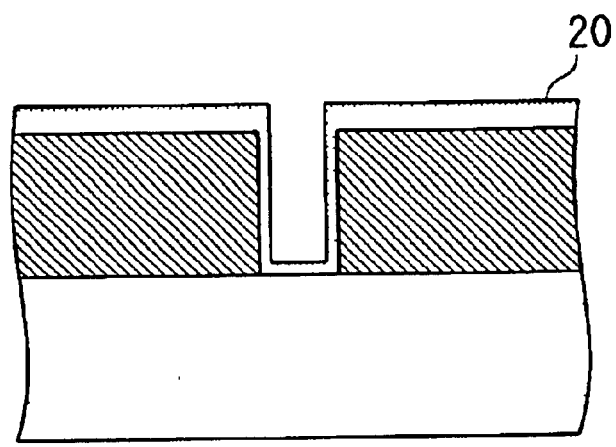
FIG. 6(a)–(c) are schematic sectional views each showing the manufacturing steps of a semiconductor device according to a fourth embodiment of the invention.
Figure 6:
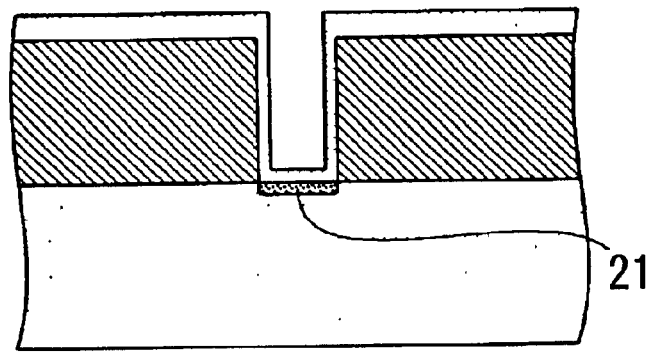
Figure 6:
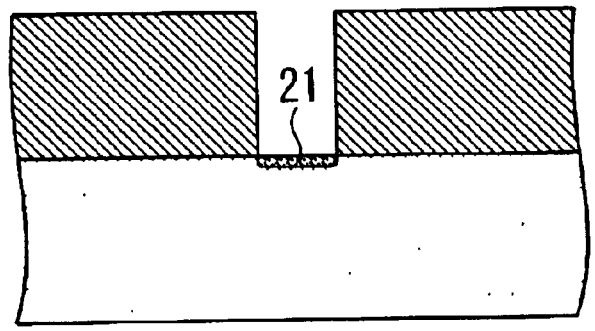
Figure 7A:
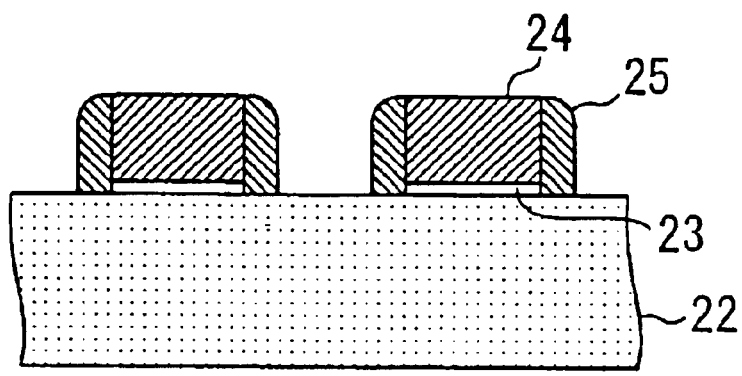
FIG. 7(a)–(c) are schematic sectional views each showing a conventional method of manufacturing a semiconductor device.
Figure 7B:
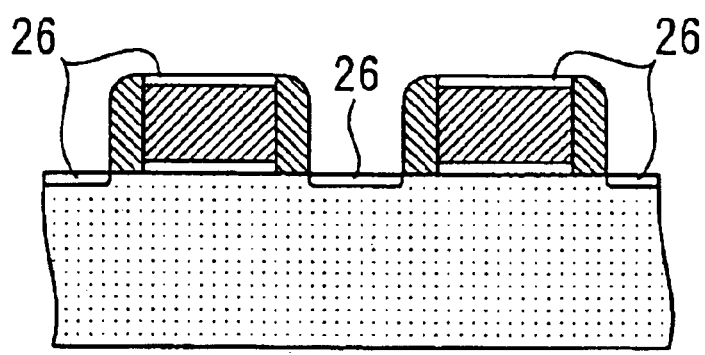
Figure 7C:
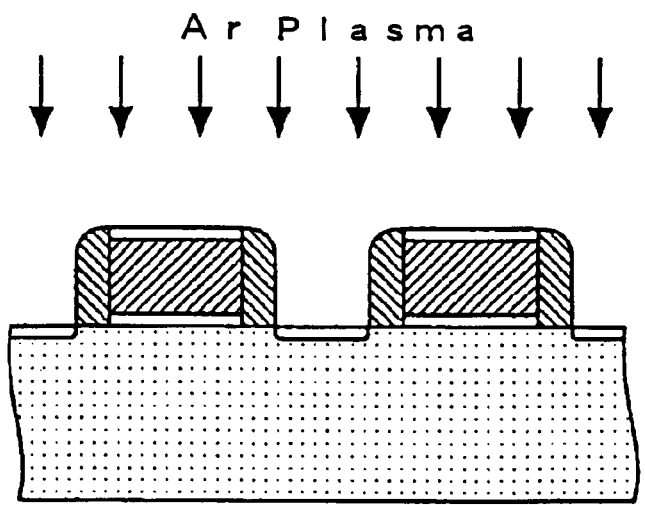
Figure 8:
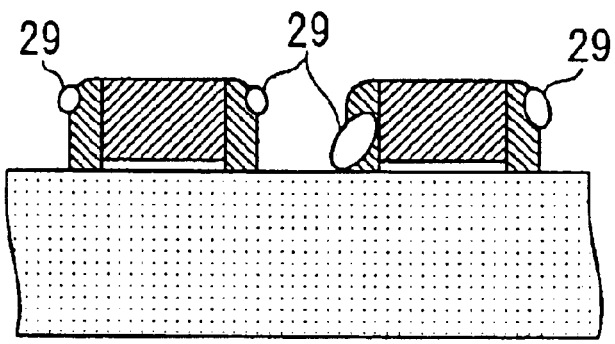
FIG. 8(a)–(c) are schematic sectional views each showing a conventional method of manufacturing a semiconductor device.
Figure 8:
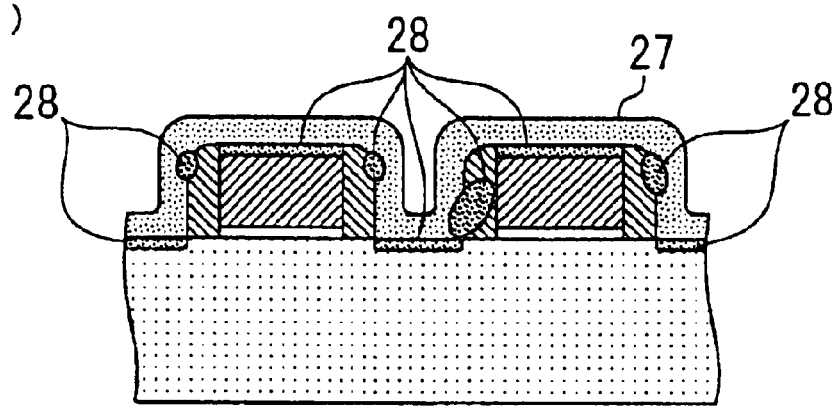
Figure 8:
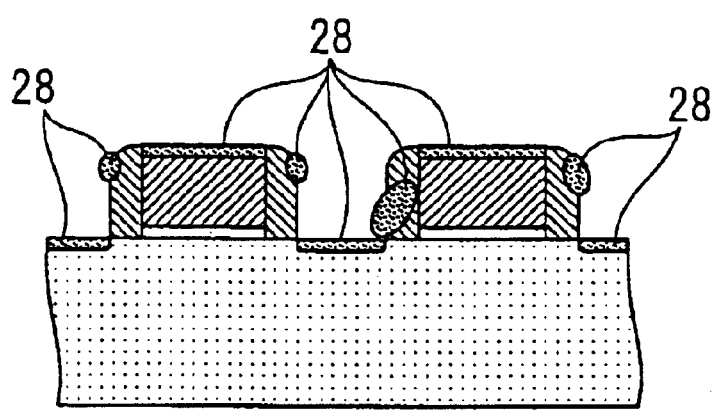

Thereafter, while keeping the system in vacuum so that a native oxide film is not formed again, the step is transferred to the formation of a cobalt film 20 (FIG. 6(a)). For instance, using the same reduced pressure vapor phase growth system as employed for the removal of the native oxide film, the cobalt film is formed by changing a feed gas. After the film formation, thermal treatment (lamp annealing) at about 400° C. to 500° C. is carried out to cause the silicon substrate 16 to react with the cobalt film 20, thereby forming a cobalt silicide film 21 (FIG. 6(c)).

Subsequently, unreacted cobalt is removed by means of an etching solution having selectivity to the silicide to provide a structure of FIG. 6(c). For the etching solution, a mixed solution of phosphoric acid, nitric acid, acetic acid and hydrogen peroxide, a mixed solution of sulfuric acid and hydrogen peroxide or a mixed solution of hydrochloric acid and hydrogen peroxide may be used, for example. Moreover, thermal treatment at about 650° C. to 850° C. is carried out at least once or more times to cause the crystal structure to be changed, thereby lowering the resistance of the silicide.

According to this embodiment, the use of the mixed gas of an argon gas and a nitrogen trifluoride gas for the removal of native oxide film brings about the following effects.

Where plasma etching is effected by use of an argon gas alone, the residue resulting from the plasma etching is attached to the insulating film 18 thereby causing short-circuiting as stated in the first to third embodiments. To avoid this, the etching is performed by use of the mixed gas of an argon gas and a nitrogen trifluoride gas, so that the native oxide film is removed not only physically, but also chemically, thereby preventing a residue from being attached onto the insulating film.

Although nitrogen trifluoride gas is used in this embodiment, the invention is not limited thereto. Other types of gases may also be used provided that they are capable of reaction with a silicon oxide film and etching. For instance, fluorine-containing gases, such as a hydrogen fluoride (HF) gas, a dicarbon hexafluoride (C$_2$F$_6$) gas, a carbon tetrafluoride (CF$_4$) gas, a sulfur hexafluoride (SF$_6$) and the like gas, may be used.

Moreover, although nitrogen trifluoride gas is used as the gas mixed with argon gas in this embodiment, the invention is not limited to the use thereof. A combination of two or more gases capable of reacting with a silicon oxide film may be mixed with argon gas. The ratio of the reactive gas to the argon gas should preferably be 0.5 vol % or over.

Although it is stated in this embodiment that etching is effected by use of an argon gas and a nitrogen trifluoride gas, plasma etching (i.e. such etching as used in the second embodiment) may be used in place of the above etching, in which at least one or more fluorine-containing gases selected from the group consisting of a nitrogen trifluoride gas, a hydrogen fluoride gas, a dicarbon hexafluoride gas, a carbon tetrafluoride gas and a sulfur hexafluoride gas is used. Alternatively, etching with an argon gas and subsequent etching with an aqueous hydrofluoric acid solution or an aqueous buffered hydrofluoric acid may be used (i.e. such etching as in the third embodiment). When these manners of etching are used, it can be prevent to cause a residue to be attached onto an insulating film.

It should be noted that although an instance of forming a cobalt silicide film by forming a cobalt film on a silicon substrate or a gate insulating film and reacting the cobalt film with the silicon substrate or gate insulating film has been illustrated in the the first to fourth embodiments, the invention is not limited to such instance. For instance, the method of the invention may be applied to a process where a thin film of a high melting metal, such as titanium (Ti), nickel (Ni), tungsten (W), molybdenum (Mo), chromium (Cr), or platinum (Pt), is formed and this metal is reacted with a silicon substrate or a gate insulating film to form a metal silicide such as titanium silicide, nickel silicide, tungsten silicide, molybdenum silicide, chromium silicide or platinum silicide.

The features and advantages of the present invention may be summarized as follows.

According to one aspect, a native oxide film formed on a silicon substrate and a gate electrode can be removed by plasma etching using an argon gas and a nitrogen trifluoride gas, so that the residue of the etching is not deposited on sidewalls.

According to another aspect, the possibility of damaging the silicon substrate and the gate insulating film with plasma can be reduced. Moreover, such a problem that the etched native oxide film is deposited on side walls as a residue can be solved.

According to further aspect, the residue caused by plasma etching using an argon gas can be removed.

According to further aspect, the native oxide film on a silicon substrate can be removed by plasma etching using an argon gas and a nitrogen trifluoride gas, so that the residue of the etching is not deposited on an insulating film.

According to further aspect, the native oxide film can be removed without forming a residue upon etching.

According to further aspect, the possibility of suffering damages of the silicon substrate with plasma can be reduced. Moreover, the problem of depositing the etched native oxide film on the insulating film as a residue can be solved.

According to further aspect, the residue caused by plasma etching using an argon gas can be removed.

According to still further aspect, an etched native oxide is prevented from re-deposition as a residue, and a parasitic capacitance is so reduced as to realize a high-speed device.

For further reference, a method for manufacturing a semiconductor device, according to the present invention may be summarized as follows.

According to one aspect, the method comprises the steps of: forming a gate electrode, made of polysilicon, on a silicon substrate through a gate insulating film; forming a sidewall, made of an insulating film, on side of said gate electrode; removing native oxide films formed on the surfaces of said silicon substrate and said gate electrode by plasma etching with use of at least one or more fluorine gases selected from the group consisting of a nitrogen trifluoride gas, a hydrogen fluoride gas, a dicarbon hexafluoride gas, a carbon tetrafluoride gas and a sulfur hexafluoride gas; and forming a metal silicide film on said silicon substrate and said gate electrode.

According to another aspect, the method comprises the steps of: forming an insulating film on a silicon substrate; forming, in said insulating film, contact holes for exposing said silicon substrate therethrough; removing a native oxide film formed on a silicon substrate surface exposed from said contact holes by plasma etching with use of at least one or more fluorine gases selected from the group consisting of a nitrogen trifluoride gas, a hydrogen fluoride gas, a dicarbon hexafluoride gas, a carbon tetrafluoride gas and a sulfur hexafluoride gas; and forming a metal silicide film on said silicon substrate from which said native oxide film has been removed.

According to another aspect, the method comprises the steps of: forming an insulating film on a silicon substrate; forming, in said insulating film, contact holes for exposing said silicon substrate therethrough; removing a native oxide film formed on a silicon substrate surface exposed from said contact holes by plasma etching with use of an argon gas; etching said insulating film with an aqueous hydrofluoric acid solution or an aqueous buffered hydrofluoric acid solution for lift-off to remove a residue of the plasma etching deposited on said insulating film; and forming a metal silicide film on said silicon substrate from which said native oxide film has been removed.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-125948, filed on Apr. 26, 2002 including specification, claims, drawings and summary, on which the Convention priority of the present application is based, are incorporated herein by reference in its entirety.

What is claimed is:

1. A method for manufacturing a semiconductor device, comprising the steps of:
   forming a gate electrode, made of polysilicon, on a silicon substrate through a gate insulating film;
   forming a sidewall, comprising a combination of a silicon oxide film, and a silicon nitride film on a side of said gate electrode;
   removing a native oxide film on the surfaces of said silicon substrate and said gate electrode in a reduced pressure vapor phase system by plasma etching with a mixed gas of a) at least one fluorine containing gas selected from the group consisting of a hydrogen fluoride gas, and a dicarbon hexafluoride gas, and b) an argon gas, wherein said at least one fluorine containing gas is at a concentration of not less than 0.5 vol.% relative to said argon gas; and
   forming a metal silicide film on said silicon substrate and said gate electrode after removing said native oxide film while maintaining said system in vacuum.

2. A method for manufacturing a semiconductor device according to claim 1 wherein said metal suicide consists of a silicide of at least one metal selected from the group consisting of cobalt, titanium, nickel, tungsten, molybdenum, chromium and platinum.

3. A method for manufacturing a semiconductor device, comprising the steps of:
   forming a gate electrode, made of polysilicon, on a silicon substrate through a gate insulating film;
   forming a sidewall, made of a combination of a silicon oxide film and a silicon nitride film on a side of said gate electrode;
   removing native oxide films formed on the surfaces of said silicon substrate and said gate electrode by plasma etching with use of an argon gas,
   etching said sidewall with an aqueous buffered hydrofluoric acid solution for lift-off to remove a residue of the plasma etching deposited on said sidewall; and
   forming a metal suicide film on said silicon substrate and said gate electrode.

4. A method for manufacturing a semiconductor device, consisting essentially of the steps of:
   forming an insulating film on a silicon substrate;
   forming, in said insulating film, contact holes for exposing said silicon substrate therethrough;
   removing a native oxide film formed on a silicon substrate surface exposed from said contact holes in a reduced pressure vapor phase system by one-step plasma etching using a mixed gas of a) a hydrogen fluoride gas or a dicarbon hexafluoride gas, and b) an argon gas; and
   forming a metal silicide film on said silicon substrate, from which said native oxide film has been removed, while maintaining said system in vacuum.

5. The method according to claim 4, wherein said mixed gas comprises argon and a dicarbon hexafluoride gas.

6. The method according to claim 4, wherein the metal silicide is selected from the group consisting of a cobalt silicide, a nickel silicide, a titanium silicide, a molybdenum silicide, a chromium silicide and a platinum silicide.

* * * * *